(12) United States Patent
Lasserre et al.

(10) Patent No.: US 12,155,401 B2
(45) Date of Patent: Nov. 26, 2024

(54) METHODS AND DEVICES FOR TREE SWITCHING IN POINT CLOUD COMPRESSION

(71) Applicant: BlackBerry Limited, Waterloo (CA)

(72) Inventors: Sébastien Lasserre, Thorigné-Fouillard (FR); Jonathan Taquet, Talensac (FR); Gaëlle Christine Martin-Cocher, Toronto (CA)

(73) Assignee: BlackBerry Limited, Waterloo (CA)

( * ) Notice: Subject to any disclaimer, the term of this patent is extended or adjusted under 35 U.S.C. 154(b) by 67 days.

(21) Appl. No.: 17/767,357

(22) PCT Filed: Oct. 11, 2019

(86) PCT No.: PCT/IB2019/001188
§ 371 (c)(1),
(2) Date: Apr. 7, 2022

(87) PCT Pub. No.: WO2021/069949
PCT Pub. Date: Apr. 15, 2021

(65) Prior Publication Data
US 2022/0376702 A1    Nov. 24, 2022

(51) Int. Cl.
*H03M 7/40*    (2006.01)
*H03M 7/30*    (2006.01)

(52) U.S. Cl.
CPC .............. *H03M 7/40* (2013.01); *H03M 7/70* (2013.01)

(58) Field of Classification Search
CPC .................................. H03M 7/40; H03M 7/70
(Continued)

(56) References Cited

U.S. PATENT DOCUMENTS 8,217,938 B2    7/2012 Chen et al.
11,710,259 B2 *  7/2023 Zhang ..................... G06T 9/001
                                              382/232
(Continued)

FOREIGN PATENT DOCUMENTS

EP         3745355 A1      12/2020
WO   WO2019142834 A1       1/2021
WO   WO2019146691 A1       2/2021

OTHER PUBLICATIONS

Canadian Intellectual Property Office (CIPO) Official Action and Examination Search Report for Application No. 3,153,825 (PCT No. IB2019001188) dated Nov. 3, 2023, 4 pages.
(Continued)

*Primary Examiner* — Peguy Jean Pierre
(74) *Attorney, Agent, or Firm* — Moffat & Co

(57) ABSTRACT

Methods and devices for coding point cloud data using volume trees and predicted-point trees. In one embodiment of the disclosure, a method of encoding a point cloud data to generate a bitstream of compressed point cloud data representing a three-dimensional location of a physical object is provided, the point cloud data being located within a volumetric space. The method includes compressing a first part of the point cloud data represented by a first tree of a first type; determining for a given node of the first tree if an assignation to a second type of tree is enabled, said given node still being processed for the first tree; when the assignation is enabled, compressing a second part of the point cloud data represented by a second tree of the second type wherein, features associated with a root node of the second tree are at least partially obtained from the given node.

15 Claims, 9 Drawing Sheets

(58) Field of Classification Search
USPC .......................................... 341/50, 51, 67, 65
See application file for complete search history.

(56) References Cited

U.S. PATENT DOCUMENTS

| | | | |
|---|---|---|---|
| 11,895,307 | B2 | 2/2024 | Mammou et al. |
| 2013/0235050 | A1 | 9/2013 | Karras |
| 2019/0087979 | A1* | 3/2019 | Mammou ............ H04N 19/597 |
| 2019/0253835 | A1 | 8/2019 | Jones |
| 2022/0366610 | A1 | 11/2022 | Hur et al. |
| 2023/0162402 | A1* | 5/2023 | Zhang ........................ G06T 9/40 |
| | | | 382/232 |

OTHER PUBLICATIONS

Patent Cooperation Treaty, International Search Report for International application No. PCT/IB2019/001188, issued Jun. 5, 2020.
Extended European Search Report, EP Application No. 19948475.9, Issued May 23, 2023.
Rufael Mekuria, "Point Cloud Compression Tutorial", Unified Streaming and Point Cloud Compression IEEE Visual Communications and Image Processing, Aug. 1, 2018, XP055653111, retrieved from https://www.slideshare.net/RufaelMekuria/tutorial-on-point-cloud-compression-and-standardisation.
United States Patent and Trademark Office (USPTO) Notice of Allowance for U.S. Appl. No. 17/771,354 mailed Jul. 26, 2024, 55 pages.
Jae-Kyum Ahn et al., "Large Scale 3D Point Cloud Compression Using Adaptive Radial Distance Prediction in Hybrid Coordinate Domains" in IEEE Journal of Selected Topics in Signal Processing, Apr. 2015, vol. 9, No. 3, pp. 422-434.
Ismael Daribo et al., et al., "Adaptive Arithmetic Coding For Point Cloud Compression", 2012 3DTV-Conference: The True Vision—Capture, Transmission and Display of 3D Video (3DTV-CON), Zurich, Switzerland, 2012, pp. 1-4.
Patent Cooperation Treaty, International Search Report for International Application No. PCT/IB2019/001268, mailed Jun. 8, 2020, 3 pages.
Gustavo Sandri et al., "Point Cloud Compression Incorporating Region of Interest Coding", 126 MPEG Meeting, 2019, 6 pages.
Sebastein Lasserre et al., An improvement of the planar coding mode (paper), ISO/IEC JTC1/SC29/WG11 MPEG2019/m50642, Oct. 2019, Geneva, CH, 4 pages.
Sebastein Lasserre et al., An improvement of the planar coding mode: The angular coding mode (presentation), MPEG2019/m50642, 2019, 33 pages.
Chenxi Tu et al. "Real-Time Streaming Point Cloud Compression for 3D LiDAR Sensor Using U-Net", IEEE Access, received Jun. 25, 2019, accepted Aug. 2, 2019, date of publication Aug. 14, 2019, date of current version Aug. 28, 2019, 10 pages.
Stefan Gumhold et al., "Predictive point-cloud compression", Jul. 31, 2005, 1077952576-1077952576, Jul. 2005, pp. 137-es, XP058302295.
Sebastian Schwarz et al., "Emerging MPEG Standards for Point Cloud Compression" IEEE Journal on Emerging and Selected Topics in Circuits and Systems, Mar. 2019, Vol. 9, No. 1, 16 pages.
Canadian Intellectual Property Office (CIPO) Office Action for Application No. 3,153,825, dated Aug. 29, 2024, 4 pages.

* cited by examiner

METHODS AND DEVICES FOR TREE SWITCHING IN POINT CLOUD COMPRESSION

FIELD

The present application generally relates to point cloud compression and, in particular to methods and devices for handling tree structures for representing point cloud data.

BACKGROUND

Data compression is used in communications and computer networking to store, transmit, and reproduce information efficiently. There is an increasing interest in representations of three-dimensional objects or spaces, which can involve large datasets and for which efficient and effective compression would be highly useful and valued. In some cases, three-dimensional objects or spaces may be represented using a point cloud, which is a set of points each having a three-coordinate location (X, Y, Z) and, in some cases, other attributes like colour data (e.g. luminance and chrominance), transparency, reflectance, normal vector, etc. Point clouds can be static (a stationary object or a snapshot of an environment/object at a single point in time) or dynamic (a time-ordered sequence of point clouds).

Example applications for point clouds include topography and mapping applications. Autonomous vehicle and other machine-vision applications may rely on point cloud sensor data in the form of 3D scans of an environment, such as from a LiDAR scanner. Virtual reality simulations may rely on point clouds.

It will be appreciated that point clouds can involve large quantities of data and compressing (encoding and decoding) that data quickly and accurately is of significant interest. Accordingly, it would be advantageous to provide for methods and devices that more efficiently and/or effectively compress data for point clouds. Such methods may result in savings in storage requirements (memory) through improved compression, or savings in bandwidth for transmission of compressed data, thereby resulting in improved operation of 3D vision systems, such as for automotive applications, or improved speed of operation and rendering of virtual reality systems, as examples.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
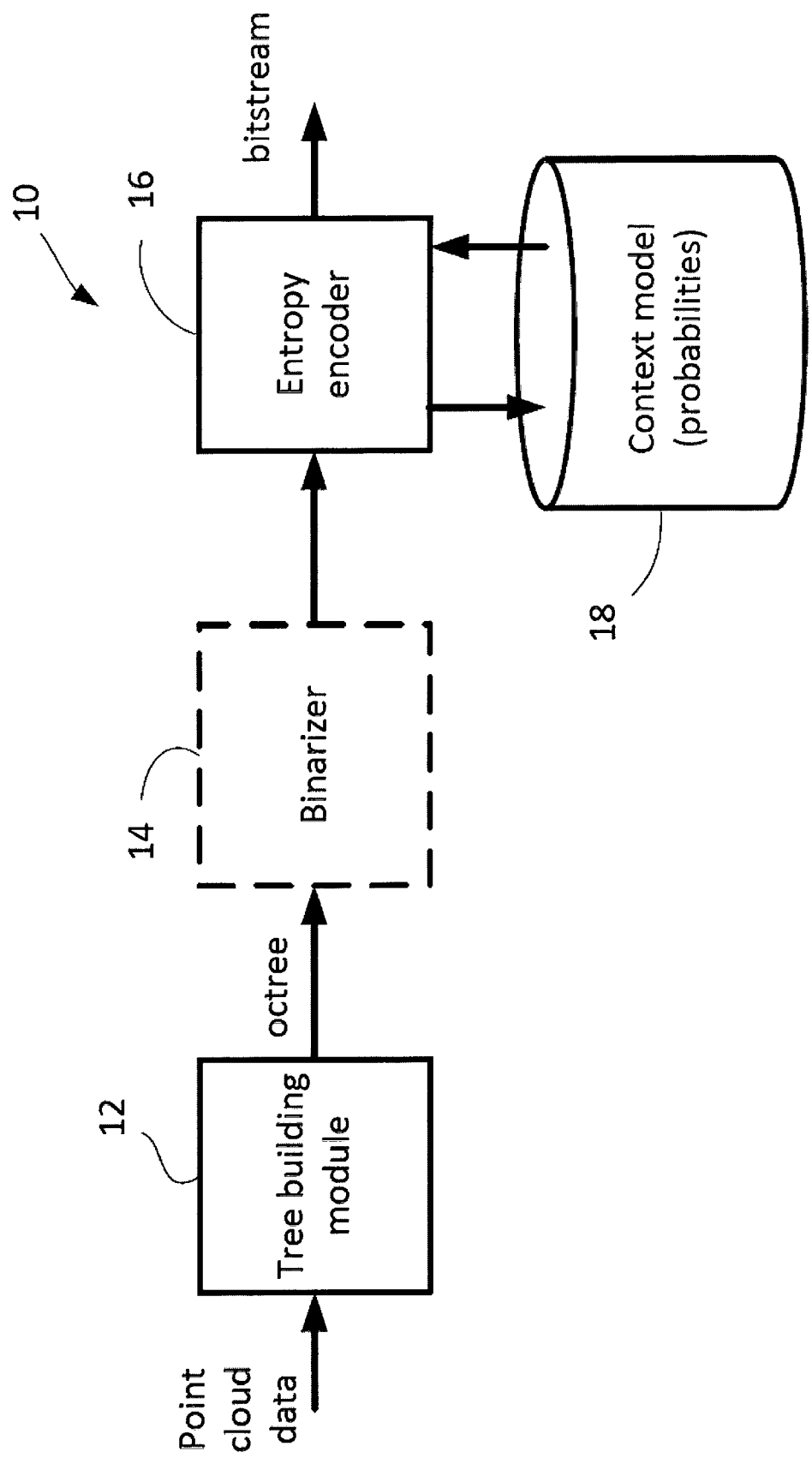
FIG. 1 shows a simplified block diagram of an example point cloud encoder.

The present application describes methods of encoding and decoding point clouds, and encoders and decoders for encoding and decoding point clouds.

In one aspect, the present application describes a method of encoding a point cloud data to generate a bitstream of compressed point cloud data representing a three-dimensional location of a physical object, the point cloud data being located within a volumetric space, the method comprising: compressing a first part of the point cloud data represented by a first tree of a first type; determining for a given node of the first tree if an assignation to a second type of tree is enabled, said given node still being processed for the first tree; when the assignation is enabled, compressing a second part of the point cloud data represented by a second tree of the second type, wherein features associated with a root node of the second tree are at least partially obtained from the given node.

In another aspect, the present application describes the method of encoding as further comprising encoding in the bitstream an assignation flag to signal whether an assignation of the second type of tree is performed or not for the given node.

In one aspect, the present application also describes a method of decoding a bitstream of compressed point cloud data representing a three-dimensional location of a physical object, for generating a point cloud data, the point cloud data being located within a volumetric space, the method comprising: decoding a first part of the point cloud data represented by a first tree of a first type; determining for a given node of the first tree if an assignation to a second type of tree is enabled, said given node still being processed for the first tree; when the assignation is enabled, decoding a second part of the point cloud data represented by a second tree of the second type, wherein features associated with a root node of the second tree are at least partially obtained from the given node.

In another aspect, the present application describes the method of decoding as further comprising decoding from the bitstream an assignation flag that signals whether an assignation to the second type of tree is performed or not for the given node.

In another aspect, the present application describes the first type or the second type of tree being a volume tree obtained by recursively splitting the volumetric space into sub-volumes containing points of the point cloud data, wherein recursively splitting the volume into sub-volumes creates the volume tree, wherein each sub-volume is associated with a node of the volume tree, such that compressed data comprises at least the occupancy information of the sub-volumes.

In another aspect, the present application describes the first type or the second type of tree being a predictive-point tree that associates at least one point of the point cloud data with each node, the position of the point being coded directly or as a residual position relatively to at least one ancestor point associated with an ancestor node of the predictive-point tree, such that compressed data comprises at least the information representative of the predicted position of the points associated with the nodes of the predictive-point tree.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

Other aspects and features of the present application will be understood by those of ordinary skill in the art from a review of the following description of examples in conjunction with the accompanying figures.

Any feature described in relation to one aspect or embodiment of the invention may also be used in respect of one or more other aspects/embodiments. These and other aspects of the present invention will be apparent from, and elucidated with reference to, the embodiments described herein.

At times in the description below, the terms "node", "volume" and "sub-volume" may be used interchangeably. It will be appreciated that, in a volume tree, a node is associated with a volume or sub-volume. The node is a particular point on the tree that may be an internal node or a leaf node. The volume or sub-volume is the bounded physical space that the node represents. The term "volume" may, in some cases, be used to refer to the largest bounded space defined for containing the point cloud. A volume may be recursively divided into sub-volumes for the purpose of building out a tree-structure of interconnected nodes for coding the point cloud data.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as colour, which may also be a three component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be a static point cloud data. The LiDAR-based scanning of an environment for machine-vision purposes may be dynamic, the point cloud may change over time, e.g. with each successive scan of a volume. The dynamic point cloud may therefore be a time-ordered sequence of point clouds.

Point cloud data may be used in a number of applications, including conservation (scanning of historical or cultural objects), mapping, machine vision (such as autonomous or semi-autonomous cars), and virtual reality systems, to give some examples. Dynamic point cloud data for applications such as machine vision can be quite different from static point cloud data used for instance for conservation purposes. Automotive vision, for example, typically involves relatively small resolution, non-coloured, highly dynamic point clouds obtained through LiDAR (or similar) sensors with a high frequency of capture. One of the main objective of such point clouds is to enable machine object detection/classification in a decision process rather than providing a high quality human viewing experience. As an example, typical LiDAR frames contain on the order of tens of thousands of points, whereas high quality virtual reality applications require several million points. It may be expected that there will be a demand for higher resolution data over time as computational speed increases and new applications are found.

While point cloud data is becoming one of the main 3D representations of data, a lack of effective and efficient compression, i.e. encoding and decoding processes, may hamper adoption and deployment. A particular challenge in coding point clouds that does not arise in the case of other data compression, like audio or video, is the coding of the geometry of the point cloud. In some applications, point clouds tend to be sparsely populated, which makes efficiently coding the location of the points much more challenging. In some other applications, like virtual reality, the point clouds may be more densely populated. In more densely populated point clouds, it may be possible to exploit local geometry (e.g. spatial correlation) to improve coding efficiencies.

Volume Trees to Represent the Geometry of a Point Cloud

One of the more common mechanisms for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on resolution of the tree and/or whether there are any points contained in the sub-volume. A leaf node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

Trees representing the geometry of a point cloud by recursively dividing the bounding three-dimensional volume into sub-volumes, whose occupancy flag indicates the presence or not of a point in the volume, are herein called "volume trees". As will be detailed later, other types of trees (e.g. not volume trees) can be used to represent the geometry of the point cloud.

A commonly-used volume tree structure is an octree. In this structure, the volumes/sub-volumes are all cubes and each split of a sub-volume results in eight further sub-volumes/sub-cubes. Another commonly-used volume tree structure is a KD-tree, in which a volume (cube or rectangular cuboid) is recursively divided in two by a plane orthogonal to one of the axes. Octrees are a special case of KD-trees, where the volume is divided by three planes, each being orthogonal to one of the three axes. Both these examples relate to cubes or rectangular cuboids; however, the present application is not restricted to such volume tree structures and the volumes and sub-volumes may have other shapes in some applications. The partitioning of a volume is not necessarily into two sub-volumes (KD-tree) or eight sub-volumes (octree), but could involve other partitions, including division into non-rectangular shapes or involving non-adjacent sub-volumes.

In another example, the volume tree may be a quadtree such that each split of a sub-volume results in four further sub-volumes/sub-cubes.

In yet another example, the volume tree may be a binary tree such that each split of a sub-volume results in four further sub-volumes/sub-cubes.

Combination of volume trees is possible to obtain more complex structures of volume trees. For example, a volume tree may include a first type of tree (binary tree, quad tree or octree) from the root node down to a certain depth and then become a second type of tree for further depths. Similarly, a (leaf) node of a first type of volume tree may be the root node of a second type of volume tree that continues dividing the volume associate with the (leaf) node of the first type of volume tree.

The present application may refer to octrees for ease of explanation and because they are a popular candidate volume tree structure for representing the geometry of a point cloud, but it will be understood that the methods and devices described herein may be implemented using other volume tree structures.

Reference is now made to FIG. 1, which shows a simplified block diagram of a point cloud encoder 10 in accordance with aspects of the present application. The point cloud encoder 10 includes a volume tree building module 12 for receiving point cloud data and producing a volume tree (in this example, an octree) representing the geometry of the volumetric space containing point cloud and indicating the location or position of points from the point cloud in that geometry.

The basic process for creating a (volume) octree to code a point cloud may include:
1. Start with a bounding volume (cube) containing the point cloud in a coordinate system
2. Split the volume into 8 sub-volumes (eight sub-cubes)
3. For each sub-volume, mark the sub-volume with 0 if the sub-volume is empty, or with 1 if there is at least one point in it
4. For all sub-volumes marked with 1, repeat (2) to split those sub-volumes, until a maximum depth of splitting is reached
5. For all leaf sub-volumes (sub-cubes) of maximum depth, mark the leaf cube with 1 if it is non-empty, 0 otherwise The above process might be described as an occupancy-equals-splitting process, where splitting implies occupancy, with the constraint that there is a maximum depth or resolution beyond which no further splitting will occur. In this case, a single flag signals whether a node is split and hence whether it is occupied by at least one point, and vice versa. At the maximum depth, the flag signals occupancy, with no further splitting possible.

In some implementations, splitting and occupancy are independent such that a node may be occupied and may or may not be split. There are two variations of this implementation:
1. Split-then-occupied. A signal flag indicates whether a node is split. If split, then the node must contain a point—that is splitting implies occupancy. Otherwise, if the node is not to be split then a further occupancy flag signals whether the node contains at least one point. Accordingly, when a node is not further split, i.e. it is a leaf node, the leaf node must have an associated occupancy flag to indicate whether it contains any points.
2. Occupied-then-split. A single flag indicates whether the node is occupied. If not occupied, then no splitting occurs. If it is occupied, then a splitting flag is coded to indicate whether the node is further split or not.

Irrespective of which of the above-described processes is used to build the volume tree, it may be traversed in a pre-defined order (breadth-first or depth-first, and in accordance with a scan pattern/order within each divided sub-volume) to produce a sequence of bits from the flags (occupancy and/or splitting flags). This may be termed the serialization or binarization of the volume tree. As shown in FIG. 1, in this example, the point cloud encoder 10 includes a binarizer 14 for binarizing the octree (or another other type of tree) to produce a bitstream of binarized data representing the volume tree.

This sequence of bits may then be encoded using an entropy encoder 16 to produce a compressed bitstream. The entropy encoder 16 may encode the sequence of bits using a context model 18 that specifies probabilities for coding bits based on a context determination by the entropy encoder 16. The context model 18 may be adaptively updated after coding of each bit or defined set of bits. The entropy encoder 16 may, in some cases, be a binary arithmetic encoder. The binary arithmetic encoder may, in some implementations, employ context-adaptive binary arithmetic coding (CABAC). In some implementations, coders other than arithmetic coders may be used.

In some cases, the entropy encoder 16 may not be a binary coder, but instead may operate on non-binary data. The output octree (or another other type of tree) data from the volume tree building module 12 may not be evaluated in binary form but instead may be encoded as non-binary data. For example, in the case of an octree, the eight flags within a sub-volume (e.g. occupancy flags) in their scan order may be considered a $2^8-1$ bit number (e.g. an integer having a value between 1 and 255 since the value 0 is not possible for a split sub-volume, i.e. it would not have been split if it was entirely unoccupied). This number may be encoded by the entropy encoder using a multi-symbol arithmetic coder in some implementations. Within a sub-volume, e.g. a cube, the sequence of flags that defines this integer may be termed a "pattern" or "occupancy pattern".

Like with video or image coding, point cloud coding can include predictive operations in which efforts are made to predict the location of points in a volume. From the predicted locations of points, one can predict the occupancy pattern for a sub-volume. Predictions may be spatial (dependent on previously coded sub-volumes in the same point cloud) or temporal (dependent on previously coded point clouds in a time-ordered sequence of point clouds).

Figure 2:
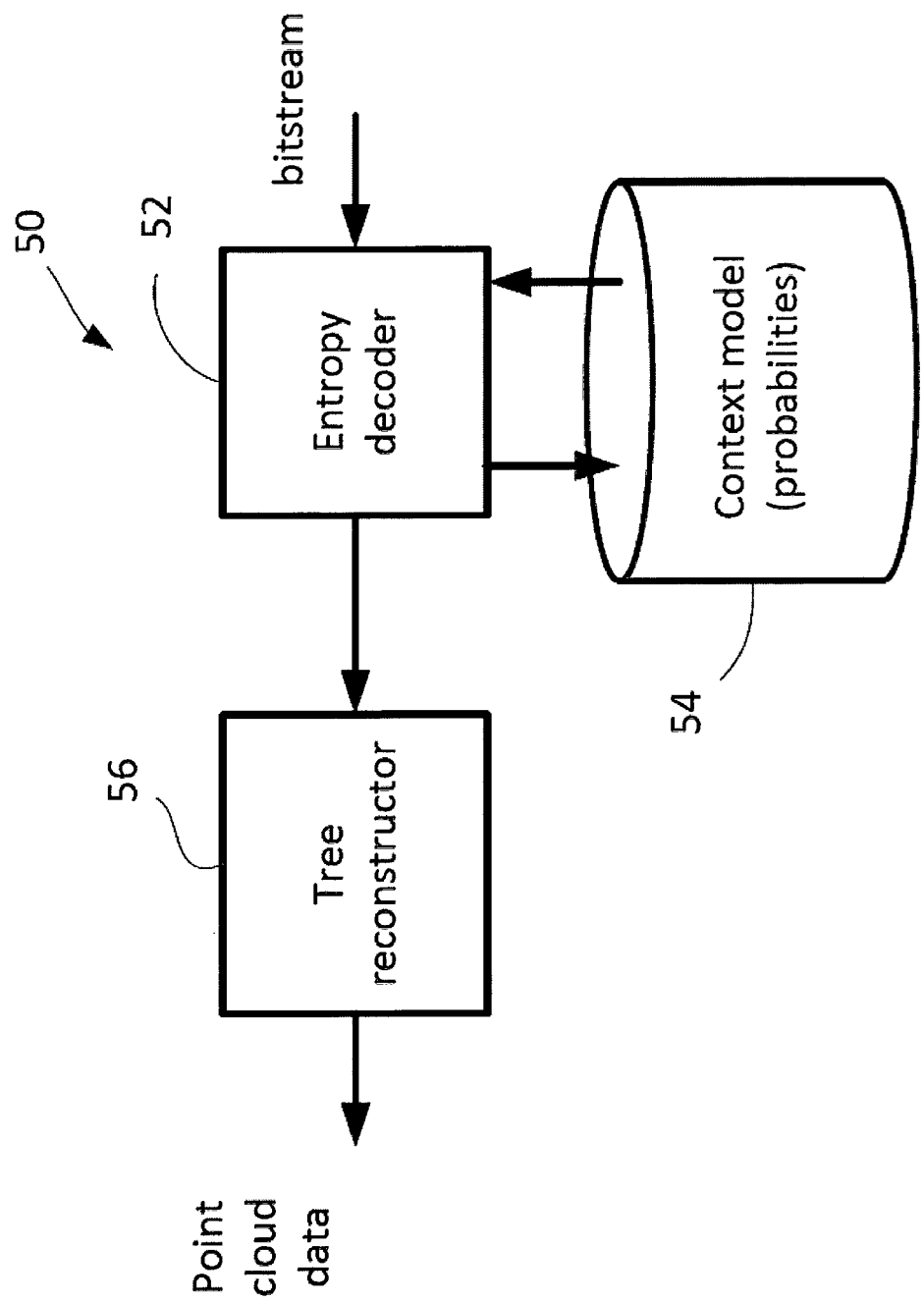
FIG. 2 shows a simplified block diagram of an example point cloud decoder.

A block diagram of an example point cloud decoder 50 that corresponds to the encoder 10 is shown in FIG. 2. The point cloud decoder 50 includes an entropy decoder 52 using the same context model 54 used by the encoder 10. The entropy decoder 52 receives the input bitstream of compressed data and entropy decodes the data to produce an output sequence of decompressed bits. The sequence is then converted into reconstructed point cloud data by a volume tree reconstructor 56. The volume tree reconstructor 56 rebuilds the tree structure from the decompressed data and knowledge of the scanning order in which the tree data was binarized. The volume tree reconstructor 56 is thus able to reconstruct the location of the points from the point cloud (subject to the resolution of the volume tree coding).

Figure 3:
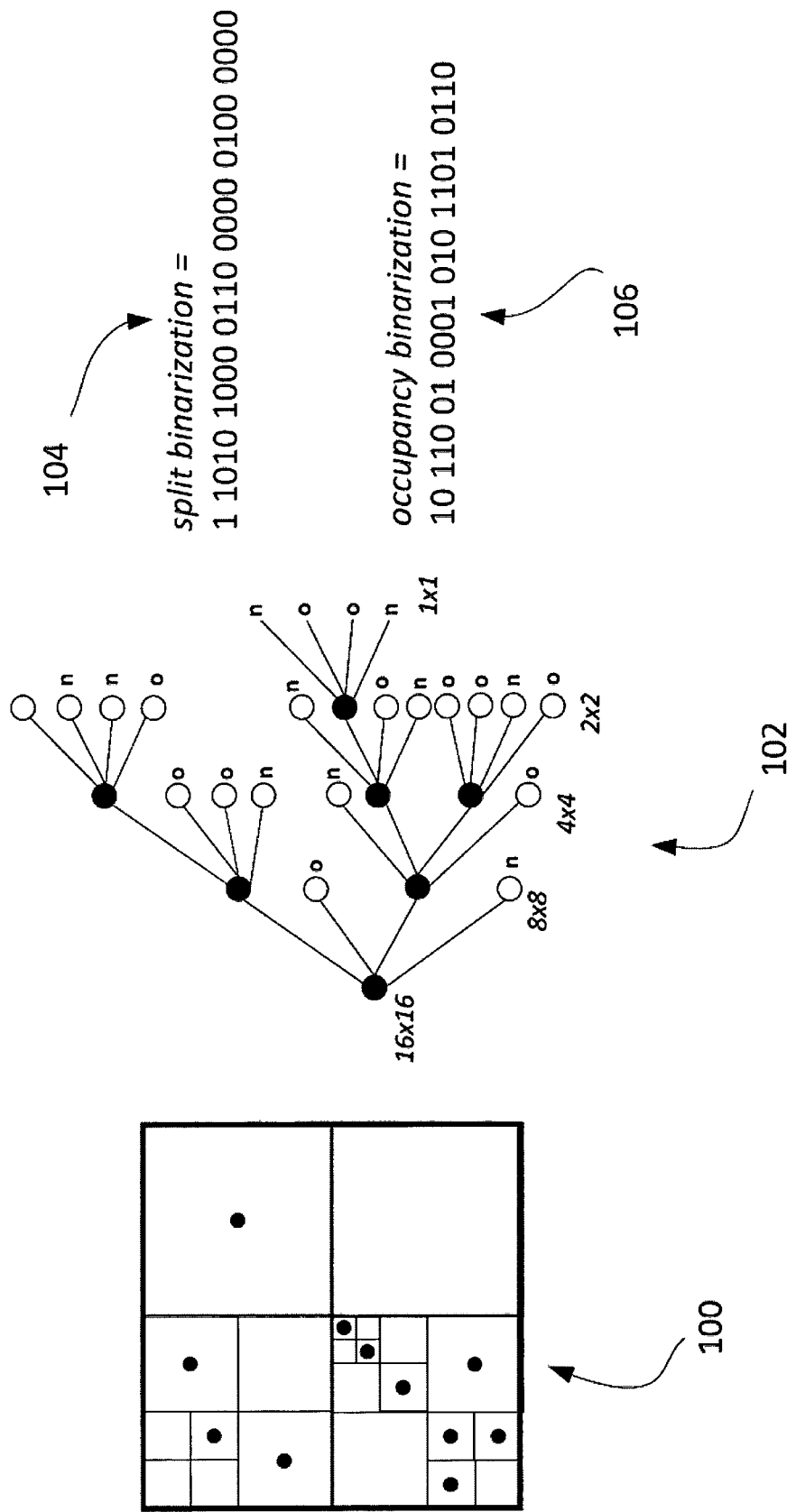
FIG. 3 shows an example partial sub-volume and associated tree structure for coding.

An example partial sub-volume 100 is shown in FIG. 3. In this example, a sub-volume 100 is shown in two-dimensions for ease of illustration, and the size of the sub-volume 100 is 16×16. It will be noted that the sub-volume has been divided into four 8×8 sub-squares, and two of those have been further subdivided into 4×4 sub-squares, three of which are further divided to 2×2 sub-squares, and one of the 2×2 sub-square is then divided into 1×1 squares. The 1×1 squares are the maximum depth of the volume tree and represent the finest resolution for positional point data. The points from the point cloud are shown as dots in the figure.

The structure of the volume tree 102 is shown to the right of the sub-volume 100. The sequence of splitting flags 104 and the corresponding sequence of occupancy flags 106, obtained in a pre-defined breadth-first scan order, is shown to the right of the volume tree 102. It will be observed that in this illustrative example, there is an occupancy flag for each sub-volume (node) that is not split, i.e. that has an associated splitting flag set to zero. These sequences may be entropy encoded.

Figure 4:
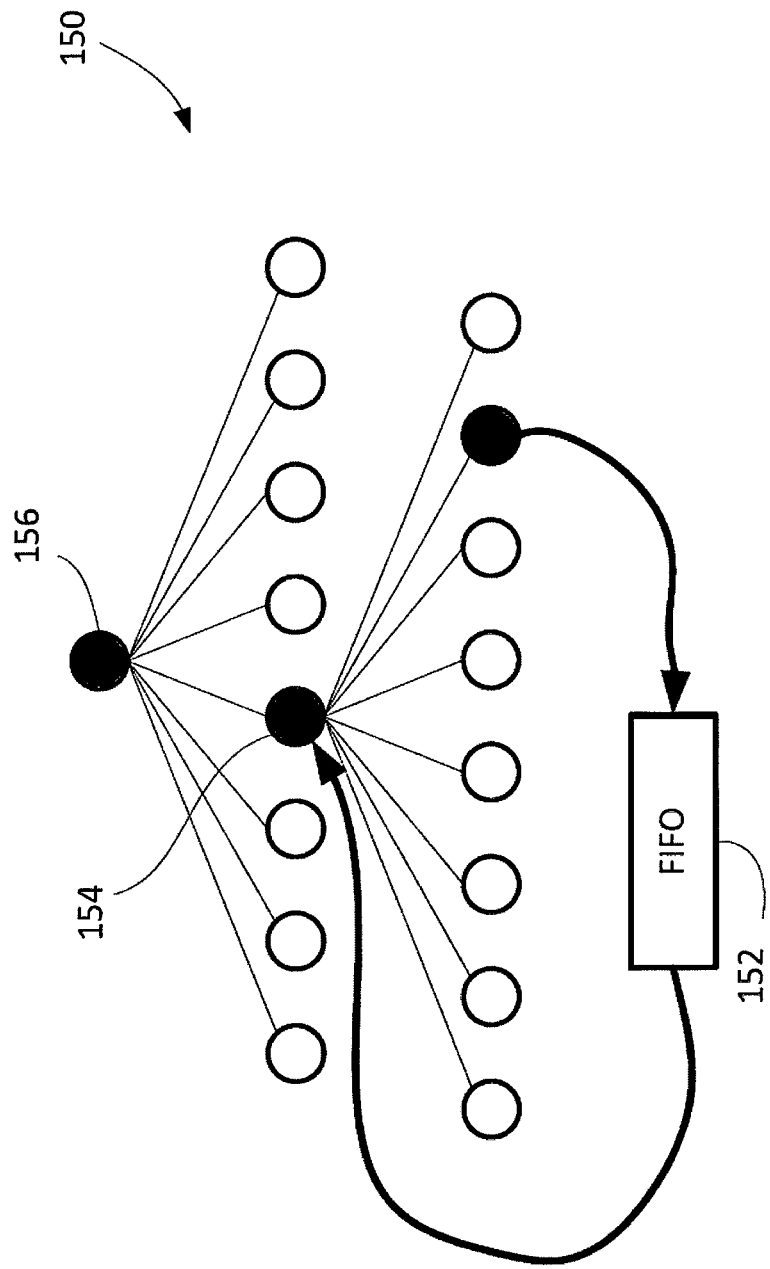
FIG. 4 illustrates the recursive splitting and coding of an octree.

Another example, which employs an occupied splitting condition, is shown in FIG. 4. FIG. 4 illustrates the recursive splitting and coding of a (volume) octree 150. Only a portion of the octree 150 is shown in the figure. A First In First Out (FIFO) 152 is shown as processing the nodes for splitting to illustrate the breadth-first nature of the present process. The FIFO 152 outputs an occupied node 154 that was queued in the FIFO 152 for further splitting after processing of its parent node 156. The volume tree builder splits the sub-volume associated with the occupied node 154 into eight sub-volumes (cubes) and determines their occupancy. The occupancy may be indicated by an occupancy flag for each sub-volume. In a prescribed scan order, the flags may be referred to as the occupancy pattern for the node 154. The pattern may be specified by the integer representing the sequence of occupancy flags associated with the sub-volumes in the pre-defined scan order. In the case of an octree, the pattern is an integer in the range [1, 255].

The entropy encoder then encodes that pattern using a non-binary arithmetic encoder based on probabilities specified by the context model. In this example, the probabilities may be a pattern distribution based on an initial distribution model and adaptively updated. In one implementation, the pattern distribution is effectively a counter of the number of times each pattern (integer from 1 to 255) has been encountered during coding. The pattern distribution may be updated after each sub-volume is coded. The pattern distribution may be normalized, as needed, since the relative frequency of the patterns is germane to the probability assessment and not the absolute count.

Based on the pattern, those child nodes that are occupied (e.g. have a flag=1) are then pushed into the FIFO 152 for further splitting in turn (provided the nodes are not a maximum depth of the volume tree). Pushing child nodes to a FIFO corresponds a breadth-first scanning order of the nodes of the volume tree. It is understood that the present application is not restricted to such scanning order. Other scanning orders include depth-first scanning order or any scanning order of the nodes of the volume tree.

In European patent application no. 18305037.6, the present applicants described methods and devices for selecting among available pattern distributions to be used in coding a particular node's pattern of occupancy based on some occupancy information from previously-coded nodes near the particular node. In one example implementation, the occupancy information is obtained from the pattern of occupancy of the parent to the particular node. In another example implementation, the occupancy information is obtained from one or more nodes neighboring the particular node.

In some implementations, the bits of an occupancy pattern occupancy may be arithmetically coded, each in turn. Each bit $b_i$ is representative of the occupancy of a respective child node of the current node (sub-volume), where an ordered string or sequence of bits, $b_0, \ldots, b_7$, is the occupancy pattern for that current node. It has been found that, at least with densely populated point clouds, the localized information from neighboring sub-volumes may be useful in predicting the occupancy of child sub-volumes of a current sub-volume. This prediction of occupancy of child nodes can be used to improve compression when coding the bit sequence signaling occupancy of the child nodes. In some cases, by using the localized prediction of child node occupancy, context selection may be more accurate, improving the arithmetic coding of the bits of the occupancy pattern. In some implementations, the neighbor-based occupancy prediction may be used to steer or drive the arithmetic coder by determining which set of contexts to use for the coding of the occupancy bits $b_i$, and other techniques, such as the neighbor configuration discussed above, may be used for selecting a particular context from the set.

Predicted-Point Trees to Represent the Geometry of a Point Cloud

Another type of tree structure that may be used to represent the geometry of a point cloud includes "predicted-point trees".

Figure 5:
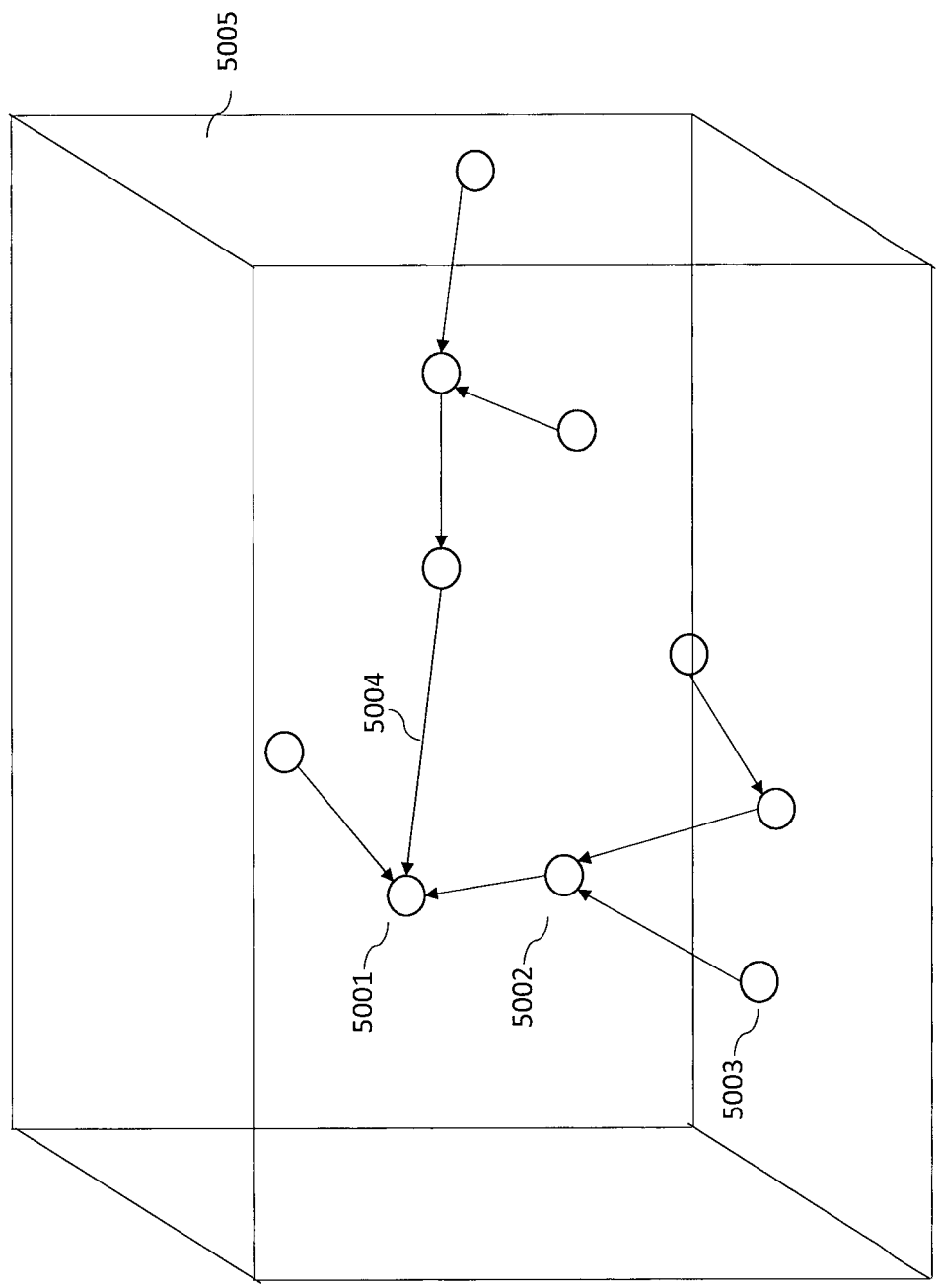
FIG. 5 shows an example of a predictive-point tree.

Z. Gao ET ALL "Predictive Geometry Coding", 128 MPEG Meeting October 2019, Geneva, CH, document no M51012, 2019-10-03, provides an example of a predicted-point. A predicted-point tree is illustrated in FIG. 5. Each node of the tree is illustrated by a circle (e.g. 5001, 5002, or 5003) and is associated with a point of the point cloud. Each arrow 5004 corresponds to a predictive branch of the tree. The tip of the arrow indicates the parent node. Node 5001 is the root node of the tree as it has no parent node. Node 5002 is an internal node of the tree, as it has a parent and at least one child. And node 5003 is a leaf node, as it has no children.

Points associated with the nodes of the predicted-point tree belong to a part of the point cloud, the part being contained in a volume 5005. The structure of the predicted-point tree is determined by the encoding process such as to typically obtain an optimal structure in term of maximum compression of the geometry of the part of the point cloud.

The coordinates (x,y,z) of a point associated with a node of the predicted-point tree are coded using the predicted-point tree coding structure by first determining predicting coordinates $(x_p, y_p, z_p)$ obtained from at least one point associated with an ancestor (parent, grand-parent, etc.) node or a sibling node of the node, then subtracting the predicting coordinates to the coordinates to obtain residual coordinates, and finally coding the residual coordinates. Residual coordinates may be coded using an entropy coder.

Predicting coordinates $(x_p, y_p, z_p)$ are obtained for instance using a linear combination of the coordinates of points associated with ancestor and/or sibling nodes. The coefficients of the linear combination may be selected from a set of possible linear combinations, and a selection index may be signaled. For instance, if p0 is the coordinate of the point associated with the parent node, p1 is the coordinate of the point associated with the grand-parent node and p2 is the coordinate of the point associated with the grand-grand-parent node, possible linear combinations to obtain predicting coordinate may be:

0*p0+0*p1+0*p2 (No prediction)
1*p0+0*p1+0*p2 (Delta prediction)

2\*p0−1\*p1+0\*p2 (Linear prediction)
2\*p0+1\*p1−1\*p2 (Parallelogram predictor)

The point associated with the root node, herein called root point, cannot be coded using any predicting coordinate (or equivalently can be coded only using the No Prediction mode) and its coordinates are coded directly relatively to the volume 5005.

A Golomb rice coding, an exp-golomb coding, or another variable length code approach, can be used as an entropy coder for coding the residual coordinates. Alternatively, contextual arithmetic coding can also be used. Parameters of the entropy coder can be chosen depending on the index of the linear combination or the distance between the ancestors: e.g. average distance between parent vs grand-parent and grand-parent vs grand-grand-parent.

The construction by the encoder of a predicted-point tree for a set of points may be performed as follows. In one embodiment, the encoder first selects one point from the set of points to be associated with the root node point of the predicted-point tree. This single root node is first considered as a leaf node because it has no child node yet. The selected point is removed from the set of points. Then, the encoder recursively selects a point from the set of points, associates the selected point with a leaf node of the predicted-point tree being constructed, and removes the selected point from the set of points. The recursive process stops when the set of points becomes empty.

In a variant, the encoder first identifies clusters of points and builds a predicted-point trees for each cluster of points by taking the closest point to the center of the cluster as the root point (e.g. point associated with the root node) and associating the other points of the cluster as its children. Then, the set of root points is considered as a new set of points to be clustered, and the process is applied recursively until the set of root points contains only one point. This variant is a bottom-up process that constructs the tree from the leaf nodes up to the root node.

The predictive structure of a predicted-point tree is entirely determined by the prediction selection index associated with each node and the number of child nodes for each node. Points coordinate can then be obtained by the decoder from the predictive structure and the residual coordinates of each point. Thus, a bitstream signaling a predicted-point tree is composed of the number of child nodes per node, the prediction selection index the residual coordinates for each node.

The scanning order of the tree may be performed following a predetermined coding order. For example, the scanning order of the predicted-point tree may be performed following a depth-first traversal of the nodes. In another example, the scanning order of the predicted-point tree may be following a breadth-first traversal of the nodes.

In a variant, the number N of child nodes for a node is less or equal to a maximum bound N_child_nodes. The number N may be coded in the bitstream for each node, knowing the maximum bound, using a Golomb Rice coding for instance. The maximum bound may be also coded in the bitstream.

In another variant, the number of points being associated with child nodes of a node is fixed or deduced algorithmically from information available to the decoder. In such a case, there is no need to signal the number of child nodes for the node.

Advantages and Limitations of Each Type of Tree

Volume trees, in combination with occupancy prediction from neighboring nodes, are a powerful tree structure to compress dense point clouds where most of points are not isolated, e.g. there is at least one occupied neighboring node of a current node whose associated volume contains a point.

It has been observed that predicted-point trees may provide better compression, relatively to volume trees, of the position of the points belonging to a sparse point cloud. A point cloud is said to be sparse when the typical distance between a point and its closest neighboring point is significantly greater than the spatial precision of the positions of the coded points. However, predicted-point trees are significantly worse than volume trees at compressing dense point clouds. Therefore, it is desirable to combine both volume trees and predicted-point trees in a flexible manner such as to obtain the best compression of the two types of trees independently on the nature (dense or sparse) of a point cloud or of a region of a point cloud.

Flexibility is understood as the local adaptation to the nature (dense or sparse) of the point cloud. Locality is needed because some practical point clouds may have regions with various densities. For example, in LiDAR-captured point clouds, the density of points varies depending on the distance from the LiDAR; dense regions are found close to the LiDAR and regions far from the LiDAR are sparse. Also, when considering a volume tree, the density of occupied child nodes depends on the depth in the volume tree. For example, when considering a sparse point cloud, at low depth (close to the root node of the volume tree) many occupied child nodes are occupied and this density of occupied child nodes decreases with increasing depth. Practically, all points clouds are seen to be dense at low depth in a volume tree.

Two switching mechanisms, e.g. from volumes trees to predicted-point trees and from predicted-point trees to volumes trees, are detailed below. These mechanisms allow for local adaptation of the tree structure (volumes tree or predicted-point tree) to the local spatial characteristics of a point cloud.

Switching mechanism may also be referred as the assignation of a second tree (e.g. volumes tree or predicted-point tree) to the given node of a first tree (e.g. volumes tree or predicted-point tree).

Switching Mechanism from a Volume Tree to a Predicted-Point Tree

Switching from a volume tree to a predicted-point tree may be decided when a node of the volume tree is identified as being sufficiently sparse, i.e. the part of the point cloud belonging to the volume associated with the node is sparse. For example, sparsity may be determined by the encoder by analyzing the point cloud, and then the encoder signals the sparsity by using a sparsity flag to indicate whether or not the node is sparse. A sparsity flag may be entropy coded for each node of the volume tree node. In order to avoid coding sparsity flags for all nodes, sparsity flags may be coded only for nodes up to a given volume tree depth. The maximum depth can be signaled in the bitstream, for example in a Frame Parameter Set.

In another example, the node is determined as being sufficiently sparse by analyzing the occupancy of the neighboring node and or the neighboring nodes of a parent node. This is an implicit determination that does not require any signaling in the bitstream.

In yet another example, the node is determined as being eligible for sparsity by analyzing the occupancy of the neighboring node and or the neighboring nodes of a parent node. If the node is eligible, a sparsity flag is coded to signal whether or not the node content is sparse. Eligibility ensures avoiding coding sparsity flags for nodes that are unlikely to be sparse.

When a node of the volume tree is identified as being sufficiently sparse, the volume tree structure is stopped, e.g. the node is a leaf node of the volume tree, and the points belonging to the volume associated with node are coded using a predicted-point tree coding structure. In this case, the volume 5005 is the volume associated with the leaf node of the volume tree.

Figure 6:
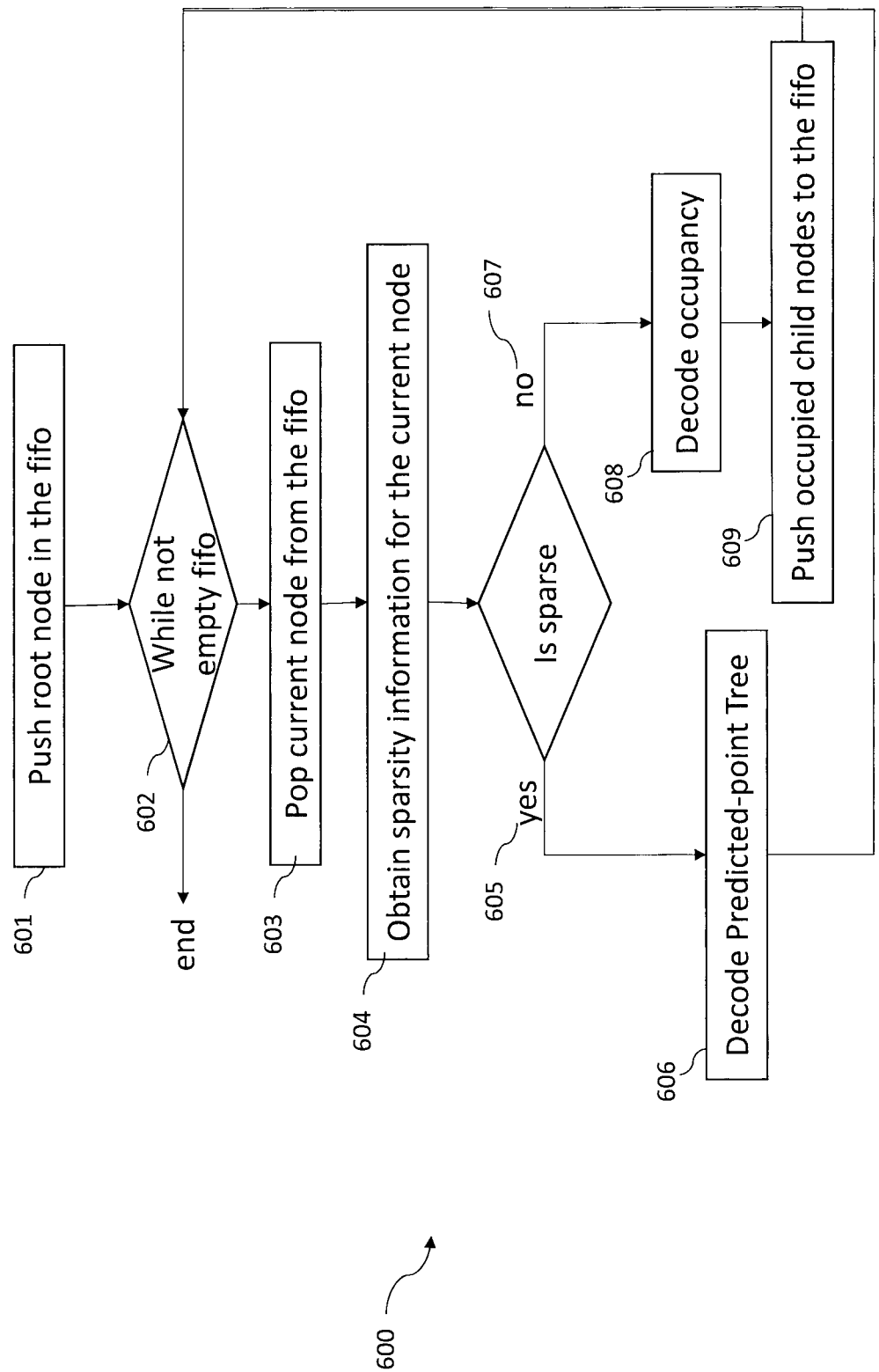
FIG. 6 shows a process diagram for an example decoder for switching from volume tree to a predictive-point tree.

Reference is now made to FIG. 6, which shows a block diagram of a process at an example decoder 600 for point cloud data. The decoder includes a FIFO buffer for holding point cloud data, such as the volumes associated with the nodes of a volume tree. As described above, the volumes are recursively partitioned into sub-volumes in accordance with a tree-based coding structure (a volume tree) such as an octree or any other type of tree. The FIFO buffer is initialized at step 601 with the root node (equivalently the root volume) of the volume tree for unique element. While the FIFO buffer is not empty (step 602), a current node is retrieved (popped) at step 603 from the FIFO buffer. Sparsity information (e.g. sparse eligibility and/or sparsity flag) is obtained at step 604 for the current node. If the current node is determined as sparse at step 605, the current node is a leaf node of the volume tree and a predicted-point tree, associated with the volume of the current node, is decoded at step 606. After decoding of the predicted-point tree, the decoder 600 then loops back to the FIFO buffer to pop another node of the volume tree. If the current node is determined as not sparse at step 607, the occupancy of the child nodes of the current node is determined at step 608 and occupied child nodes are pushed to the FIFO buffer if they are not of maximum depth at step 609. The decoder 600 then loops back to the FIFO buffer to retrieve (pop) another node of the volume tree. Decoded points coded by the volume tree are obtained from the positions of the occupied leaf volumes associated with occupied leaf nodes of maximum depth in the volume tree.

As described above, obtaining sparsity information for the current node at step 604 may consist in part in decoding a sparsity flag. Optionally, obtaining sparsity information may at step 604 also consist in part in determining the sparsity eligibility of the current node.

The decoder 600 described in FIG. 6 is an example decoder with a breadth-first scanning order, obtained using a FIFO buffer, of the nodes of the volume tree. However, the switching mechanism from a volume tree to a predicted-point tree is not limited to any scanning order of the volume tree.

In one embodiment, determining whether a node of volume tree is identified as being sufficiently sparse can be based on a threshold value. The threshold value can indicate how many neighboring nodes are occupied, how many parent neighboring nodes are occupied, or a combination of how many neighboring and parent neighboring nodes are occupied. If the neighboring occupancy is below the threshold value, the node is determined to be sparse. The threshold value can be set or can be dynamically determine depending on the type of point cloud or content and then signal in the bitstream, for instance in a Sequence Parameter set In one embodiment, determining whether a node of a volume tree is identified as been sufficiently sparse, can be based on the dimension of the volume associated with the node, the neighboring nodes or the parent and parent neighboring nodes. For instance, it may be determined that when the parent and parent neighboring nodes have a rectangular shape, while the current node and its neighboring nodes have cubic shape, the node may be eligible for sparsity.

Switching Mechanism from a Predicted-Point Tree to a Volume Tree

Switching from a predicted-point tree to a volume tree may be advantageous in the case the point cloud can be clustered into several sufficiently dense (at the scale of the spatial precision of the coordinates of the points) clusters of points, but clusters are sparsely located (e.g. the distance that separate the cluster is large at the cluster size scale).

In a predicted-point tree, a volume tree may start from a node (preferably, but not limited to, a leaf node) of the predicted-point tree using a switching mechanism. For example, a switching flag may be encoded for each leaf node signaling whether or not to switch to a volume tree. To avoid coding a switching flag for all the leaf nodes of the predicted-point tree, only eligible nodes may be subject to the switch and the subsequent coding of the switching flag. An eligibility criterion may be fulfilled, for example, depending on the local density of points coded by the predicted-point tree.

In another embodiment, the switch to a volume tree may be performed to all leaf nodes of the predicted-point tree. In this case, no switching flag needs to be signaled.

Once the switch has been determined (by decoding the switching flag that signals a switch for example) for a current node of the predicted-point tree, a volume tree starts from a root node associated with a (root) volume. The location and size of the root volume may be directly coded in the bitstream. Optionally, the coordinate of a base point of the root volume may be coded using the prediction mechanism of the predicted-point tree. In other words, the base point is coded as a point associated with the current node. In another example, two base points may be coded to fully determine the root volume. In yet another example, one base points may be coded as well as the size and/or shape of the root volume.

In case the root volume is a cuboid, the two coded base points that determine the root volume may be diagonally opposed vertices of the cuboid.

In case the root volume is a cuboid, the root volume may be coded by coding one vertex of the cuboid and the size (width, length and height) of the cuboid.

The points coded by the volume tree, that starts from the root node associated with the (coded) root volume, are coded relatively to the root volume. For example, the decoded positions of the points, coded by the volume tree, may be obtained by adding their relative coordinates, as coded by the volume tree, to the coordinates of the root volume base point. In case the root volume is a cuboid, the base point of the root volume may be a vertex of the cuboid.

Figure 7:
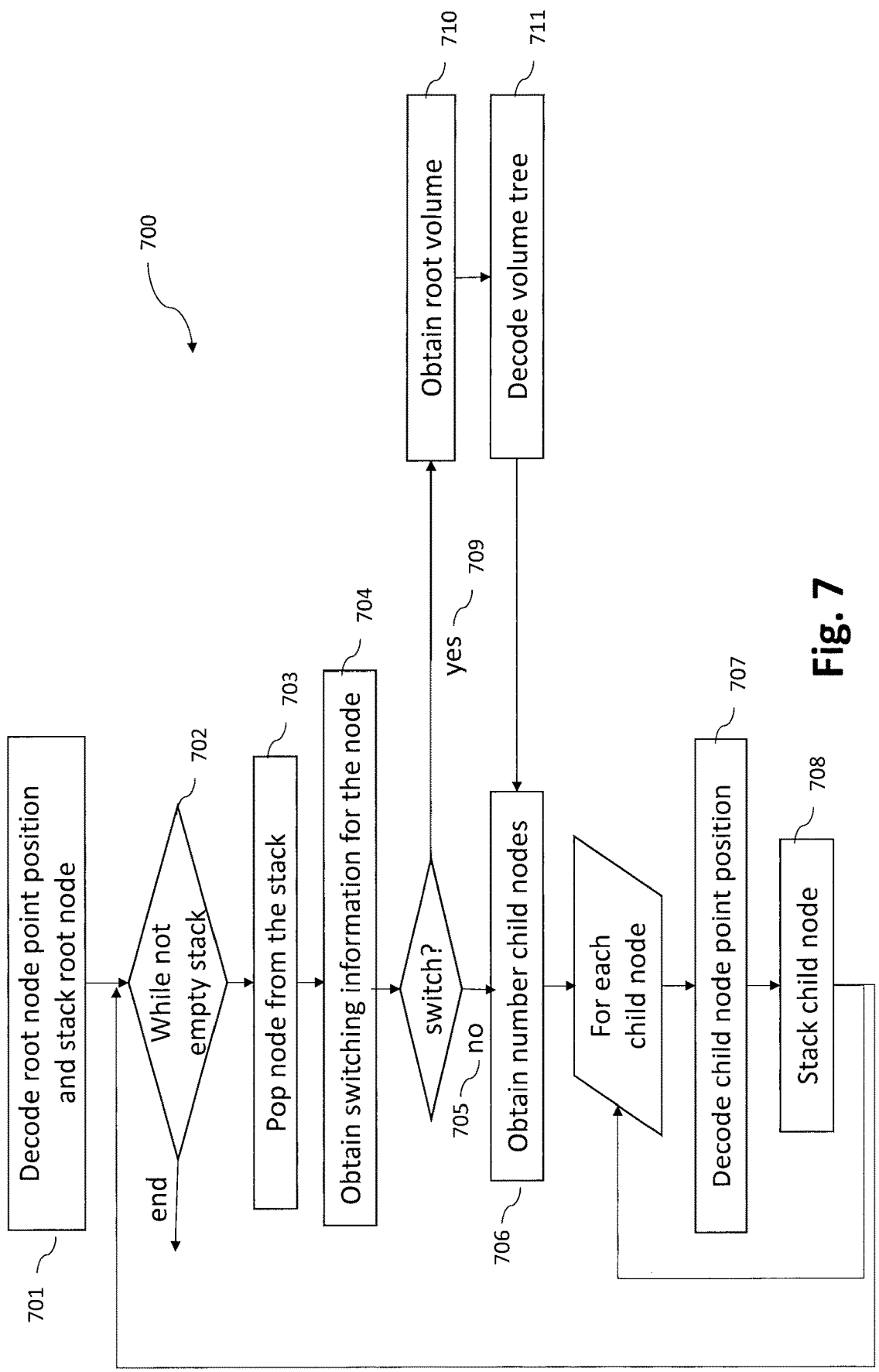
FIG. 7 shows a process diagram for an example decoder for switching from a predictive-point tree to a volume tree.

Reference is now made to FIG. 7, which shows a process diagram for an example decoder 700 for point cloud data. The decoder includes a stack buffer for holding point cloud data, such as the nodes of a predicted-point tree. In step 701, the point associated with the root node of the predicted-point tree is decoded and the root node is pushed to the stack that, at this stage, contains only the root node. Then, while the stack is not empty at step 702, a current node is retrieved (popped) from the stack following a given scanning order of the nodes at step 703. Switching information is obtained for the current node at step 704, this information may for example consist of a (decoded) switching flag.

If the obtained switching information indicates (e.g. switch flag is false) that there is no switch 705 to a volume tree, the number of child nodes of the current node is obtained (step 706). Then, for each child node of the current node, the position (e.g. 3D coordinates) of the point associated with the child node is obtained by, for example, decoding the prediction mode index and the residual coordinates at step 707, and the child node is pushed to the stack at step 708. Once all child nodes have been processed, the decoder loops back to step 702.

If the obtained switching information indicates (e.g. switch flag is true) that there is a switch 709 to a volume tree, a root volume is obtained at step 710 by decoding root volume information, and a volume tree whose root node is associated with the root volume is decoded at step 711. The decoder then processes to steps 706-708 as for the case without switching.

In another embodiment, the decoding of the volume trees may be performed after the decoding of the predicted-point tree (e.g. after the stack becomes empty) by accumulating the root volumes until the stack is empty and then processing the decoding of the volume trees associated with the root volumes.

Figure 8:
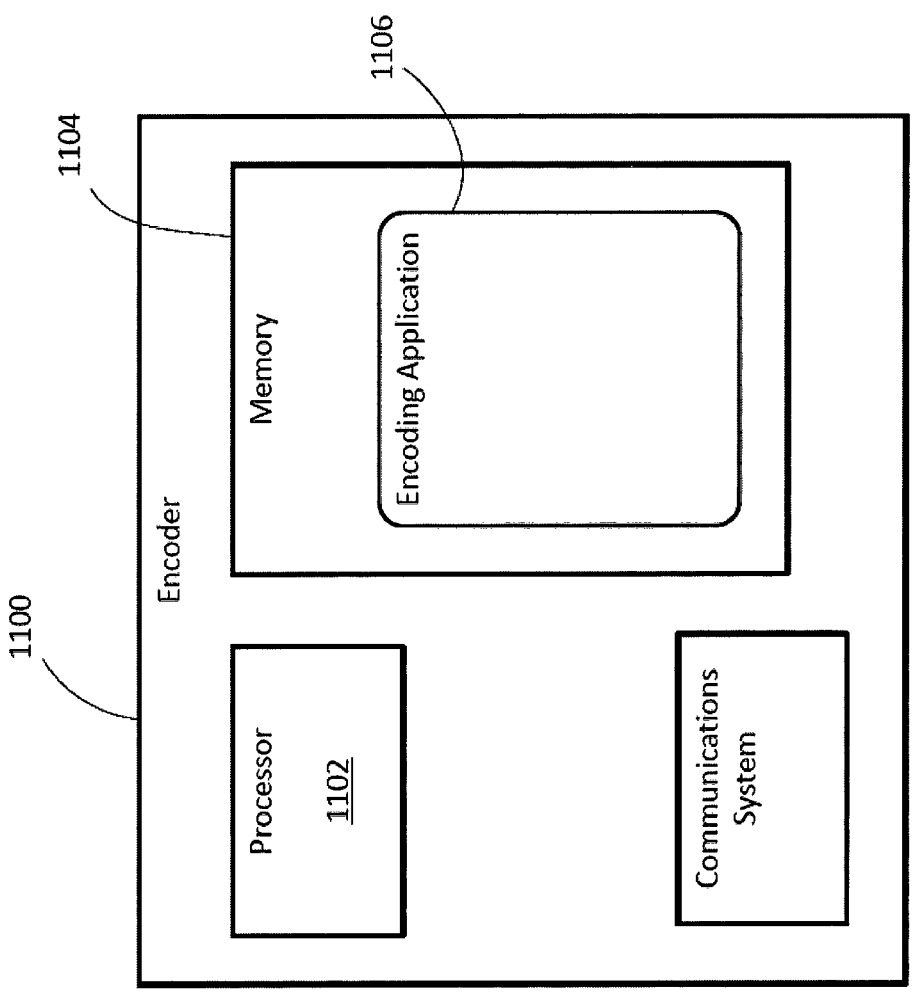
FIG. 8 shows an example simplified block diagram of an encoder.

Reference is now made to FIG. 8, which shows a simplified block diagram of an example embodiment of an encoder 1100. The encoder 1100 includes a processor 1102, memory 1104, and an encoding application 1106. The encoding application 1106 may include a computer program or application stored in memory 1104 and containing instructions that, when executed, cause the processor 1102 to perform operations such as those described herein. For example, the encoding application 1106 may encode and output bitstreams encoded in accordance with the processes described herein. It will be understood that the encoding application 1106 may be stored on a non-transitory computer-readable medium, such as a compact disc, flash memory device, random access memory, hard drive, etc. When the instructions are executed, the processor 1102 carries out the operations and functions specified in the instructions so as to operate as a special-purpose processor that implements the described process(es). Such a processor may be referred to as a "processor circuit" or "processor circuitry" in some examples.

Figure 9:
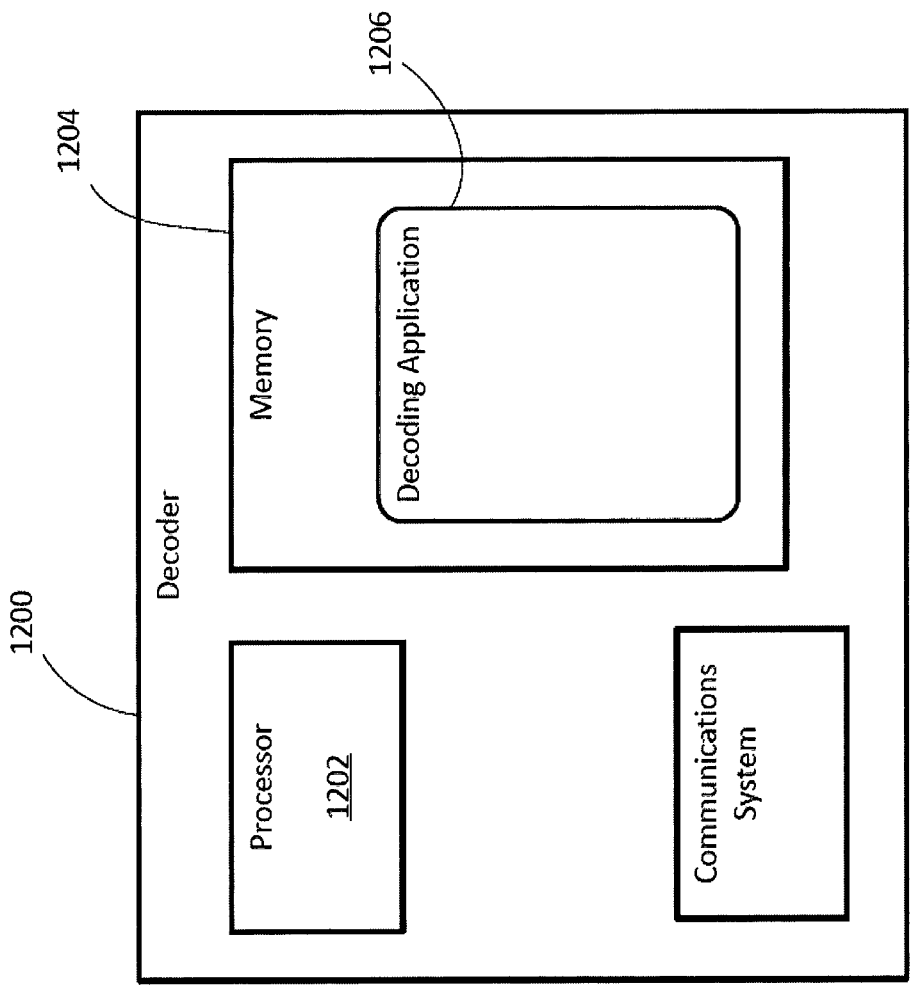
FIG. 9 shows an example simplified block diagram of a decoder.

Reference is now also made to FIG. 9, which shows a simplified block diagram of an example embodiment of a decoder 1200. The decoder 1200 includes a processor 1202, a memory 1204, and a decoding application 1206. The decoding application 1206 may include a computer program or application stored in memory 1204 and containing instructions that, when executed, cause the processor 1202 to perform operations such as those described herein. It will be understood that the decoding application 1206 may be stored on a computer-readable medium, such as a compact disc, flash memory device, random access memory, hard drive, etc. When the instructions are executed, the processor 1202 carries out the operations and functions specified in the instructions to operate as a special-purpose processor that implements the described process(es). Such a processor may be referred to as a "processor circuit" or "processor circuitry" in some examples.

It will be appreciated that the decoder and/or encoder according to the present application may be implemented in several computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Certain adaptations and modifications of the described embodiments can be made. Therefore, the above discussed embodiments are considered to be illustrative and not restrictive.

What is claimed is:

1. A method of decoding a bitstream of compressed point cloud data representing a three-dimensional location of a physical object, for generating a point cloud data, the point cloud data being located within a volumetric space, the method comprising:
   decoding a first part of the point cloud data represented by a first tree of a first type;
   determining for a given node of the first tree if an assignation to a second type of tree is enabled, said given node still being processed for the first tree, wherein determining the assignation comprises decoding from the bitstream an assignation flag that signals whether the assignation to the second type of tree is performed or not for the given node;
   when the assignation is enabled, decoding a second part of the point cloud data represented by a second tree of the second type, wherein features associated with a root node of the second tree are at least partially obtained from the given node.

2. The method of claim 1, wherein decoding the assignation flag is further subject to an eligibility condition for the given node to be eligible for assignation.

3. The method of claim 1, wherein any of the first type or the second type of tree is a volume tree obtained by recursively splitting the volumetric space into sub-volumes containing points of the point cloud data, wherein recursively splitting the volume into sub-volumes creates the volume tree, wherein each sub-volume is associated with a node of the volume tree, such that compressed data comprises at least the occupancy information of the sub-volumes.

4. The method claim 1 wherein any of the first type or the second type of tree is a predictive-point tree that associates at least one point of the point cloud data with each node, the position of the point being coded directly or as a residual position relatively to at least one ancestor point associated with an ancestor node of the predictive-point tree, such that compressed data comprises at least the information representative of the predicted position of the points associated with the nodes of the predictive-point tree.

5. The method of claim 1 wherein the first type of tree is a volume tree, the second type of tree is a predictive-point tree, and the root node of the predictive-point tree is associated with a point of the point cloud belonging to the volume associated with the given node, one of the features associated with the root node being the volumetric location of the root point.

6. The method of claim 1 wherein the first type of tree is a predictive-point tree, the second type of tree is a volume tree, and the root volume associated with the root node of the volume tree is determined at least partially from the point associated with the given node, features associated with the root node being the location and/or size of the root volume.

7. The method of the claim 6 wherein additional information on the size and/or location of the root volume is coded in the bitstream.

8. A decoder for decoding a bitstream of compressed point cloud data to produce a reconstructed point cloud representing a three-dimensional location of a physical object, the point cloud data being located within a volumetric space, the decoder comprising:
  a processor;
  a memory; and
  a decoding application containing instructions executable by the processor that, when executed, cause the processor to:
  decode a first part of the point cloud data represented by a first tree of a first type;
  determine for a given node of the first tree if an assignation to a second type of tree is enabled, said given node still being processed for the first tree, wherein determining the assignation comprises decoding from the bitstream an assignation flag that signals whether the assignation to the second type of tree is performed or not for the given node;
  when the assignation is enabled, decode a second part of the point cloud data represented by a second tree of the second type, wherein features associated with a root node of the second tree are at least partially obtained from the given node.

9. The decoder of claim 8, wherein decoding the assignation flag is further subject to an eligibility condition for the given node to be eligible for assignation.

10. The decoder of claim 8, wherein any of the first type or the second type of tree is a volume tree obtained by recursively splitting the volumetric space into sub-volumes containing points of the point cloud data, wherein recursively splitting the volume into sub-volumes creates the volume tree, wherein each sub-volume is associated with a node of the volume tree, such that compressed data comprises at least the occupancy information of the sub-volumes.

11. The decoder of claim 8, wherein any of the first type or the second type of tree is a predictive-point tree that associates at least one point of the point cloud data with each node, the position of the point being coded directly or as a residual position relatively to at least one ancestor point associated with an ancestor node of the predictive-point tree, such that compressed data comprises at least the information representative of the predicted position of the points associated with the nodes of the predictive-point tree.

12. The decoder of claim 8, wherein the first type of tree is a volume tree, the second type of tree is a predictive-point tree, and the root node of the predictive-point tree is associated with a point of the point cloud belonging to the volume associated with the given node, one of the features associated with the root node being the volumetric location of the root point.

13. The decoder of claim 8 wherein the first type of tree is a predictive-point tree, the second type of tree is a volume tree, and the root volume associated with the root node of the volume tree is determined at least partially from the point associated with the given node, features associated with the root node being the location and/or size of the root volume.

14. The decoder of the claim 13 wherein additional information on the size and/or location of the root volume is coded in the bitstream.

15. A non-transitory processor-readable medium storing processor-executable instructions that, when executed by a processor, cause the processor to:
  decode a first part of the point cloud data represented by a first tree of a first type;
  determine for a given node of the first tree if an assignation to a second type of tree is enabled, said given node still being processed for the first tree, wherein determining the assignation comprises decoding from the bitstream an assignation flag that signals whether the assignation to the second type of tree is performed or not for the given node;
  when the assignation is enabled, decode a second part of the point cloud data represented by a second tree of the second type, wherein features associated with a root node of the second tree are at least partially obtained from the given node.

* * * * *